(12) United States Patent  (10) Patent No.: US 7,719,449 B2
Fahmi et al.  (45) Date of Patent: May 18, 2010

(54) SYSTEM AND METHOD FOR FLEXIBLE PHYSICAL LAYOUT IN A HETEROGENEOUS CONFIGURABLE INTEGRATED CIRCUIT

(75) Inventors: Nadeem Fahmi, Fremont, CA (US); Jason Alexander Jones, Palo Alto, CA (US)

(73) Assignee: Agate Logic, Inc., Cupertino, CA (US)

( * ) Notice: Subject to any disclaimer, the term of this patent is extended or adjusted under 35 U.S.C. 154(b) by 0 days.

(21) Appl. No.: 12/196,036

(22) Filed: Aug. 21, 2008

(65) Prior Publication Data
US 2010/0045493 A1  Feb. 25, 2010

(51) Int. Cl.
H03M 9/00  (2006.01)
(52) U.S. Cl. ................ 341/100; 341/55; 341/101; 370/503; 375/316
(58) Field of Classification Search .......... 341/55, 341/100–101
See application file for complete search history.

(56) References Cited

U.S. PATENT DOCUMENTS 6,718,491 B1 *  4/2004  Walker et al. ........... 714/701
7,111,208 B2 *  9/2006  Hoang et al. ........... 714/716
7,305,047 B1 * 12/2007  Turner .................... 375/316
2007/0263533 A1 * 11/2007  Chiabrera ............... 370/229

* cited by examiner

*Primary Examiner*—Khai M Nguyen
(74) *Attorney, Agent, or Firm*—James M. Wu; JW Law Group

(57) ABSTRACT

A system including a serializer/deserializer (SERDES) block including a first SERDES lane, a second SERDES lane, a third SERDES lane, and a fourth SERDES lane; a physical coding sublayer (PCS) block including a layout select tag, a first PCS lane connected to the fourth SERDES lane, a second PCS lane connected to the third SERDES lane, a third PCS lane connected to the second SERDES lane, and a fourth PCS lane connected to the first SERDES lane; and a media access control (MAC) layer block including a first plurality of pins connected to the first PCS lane, a second plurality of pins connected to the second PCS lane, a third plurality of pins connected to the third PCS lane, and a fourth plurality of pins connected to the fourth PCS lane, wherein the PCS block is configured to map the first SERDES lane to the first plurality of pins, the second SERDES lane to the second plurality of pins, the third SERDES lane to the third plurality of pins, and the fourth SERDES lane to the fourth plurality of pins based on a value of the layout select tag.

17 Claims, 6 Drawing Sheets

US 7,719,449 B2

SYSTEM AND METHOD FOR FLEXIBLE PHYSICAL LAYOUT IN A HETEROGENEOUS CONFIGURABLE INTEGRATED CIRCUIT

CROSS REFERENCES TO RELATED APPLICATIONS

The present application contains subject matter that may be related to the subject matter in U.S. application Ser. No. 11/901,182 entitled: "High-Bandwidth Interconnect Network for an Integrated Circuit", filed on Sep. 14, 2007, and assigned to the assignee of the present application.

U.S. application Ser. No. 11/901,182 is hereby incorporated in its entirety by reference.

BACKGROUND

Digital systems can be implemented using off-the-shelf integrated circuits. However, system designers can often reduce cost, increase performance, and/or add capabilities by employing in the system some integrated circuits whose logic functions can be customized. Two common kinds of customizable integrated circuits in digital systems are application-specific integrated circuits (ASICs) and field-programmable gate arrays (FPGAs).

ASICs are designed and manufactured for a particular application. An ASIC includes circuits selected from a library of small logic cells. A typical ASIC also includes large special-purpose blocks that implement widely-used functions, such as a multi-kilobit random-access memory (RAM) or a microprocessor. The logic cells and special-function blocks must be placed at suitable locations on the ASIC and connected by means of wiring.

Field-programmable gate arrays (FPGAs) are another kind of customizable integrated circuit that is common in digital systems. An FPGA is a general-purpose device. It is meant to be configured for a particular application by the system designer.

The design of an integrated circuit (i.e., FPGA and/or ASIC) may require multiple instances of the same functional block. Further, the design may include different physical layouts for each instance of the functional block. The existence of a single version of said functional block that could be used for any of said physical layouts is desirable and would increase design flexibility.

SUMMARY

In general, in one aspect, the invention relates to a system. The system comprises: a serializer/deserializer (SERDES) block comprising a first SERDES lane, a second SERDES lane, a third SERDES lane, and a fourth SERDES lane; a physical coding sublayer (PCS) block comprising a layout select tag, a first PCS lane operatively connected to the fourth SERDES lane, a second PCS lane operatively connected to the third SERDES lane, a third PCS lane operatively connected to the second SERDES lane, and a fourth PCS lane operatively connected to the first SERDES lane; and a media access control (MAC) layer block comprising a first plurality of pins operatively connected to the first PCS lane, a second plurality of pins operatively connected to the second PCS lane, a third plurality of pins operatively connected to the third PCS lane, and a fourth plurality of pins operatively connected to the fourth PCS lane, wherein the PCS block is configured to map the first SERDES lane to the first plurality of pins, the second SERDES lane to the second plurality of pins, the third SERDES lane to the third plurality of pins, and the fourth SERDES lane to the fourth plurality of pins based on a value of the layout select tag.

In general, in one aspect, the invention relates to a method of manufacture. The method comprising disposing a first serialzer/deserializer (SERDES) block comprising a first SERDES lane, a second SERDES lane, a third SERDES lane, and a fourth SERDES lane on a board; disposing a first physical coding sublayer (PCS) block comprising a first layout select tag, a first PCS lane, a second PCS lane, a third PCS lane, and a fourth PCS lane on the board; and connecting the first PCS block to the first SERDES block on the board according to a first layout, wherein the first layout connects the first PCS lane to fourth SERDES lane, the second PCS lane to the third SERDES lane, the third PCS lane to the second SERDES lane, and the fourth PCS lane to the first SERDES lane, wherein the first PCS lane is operatively connected to a first plurality of pins on a media access control (MAC) layer block, the second PCS lane is operatively connected to a second plurality of pins on the MAC layer block, the third PCS lane is operatively connected to a third plurality of pins on the MAC layer block, and the fourth PCS lane is operatively connected to a fourth plurality of pins on the MAC layer block, and wherein the PCS block is configured to map the fourth SERDES lane to the first plurality of pins, the third SERDES lane to the second plurality of pins, the second SERDES lane to the third plurality of pins, and the first SERDES lane to the fourth plurality of pins based on a value of the first layout select tag.

In general, in one aspect, the invention relates to a method. The method comprises setting a layout select tag of a physical coding sublayer (PCS) block based on a layout connecting the PCS block and a serializer/deserializer (SERDES) block, wherein the PCS block comprises a first PCS lane, a second PCS lane, a third PCS lane, and a fourth PCS lane; transferring a data element from the SERDES block to the first PCS lane; and forwarding the data element from the first PCS lane to a media access control (MAC) layer block operatively connected to the fourth PCS lane based on the layout select tag.

Other aspects of the invention will be apparent from the following description and the appended claims.

DETAILED DESCRIPTION

Figure 1:
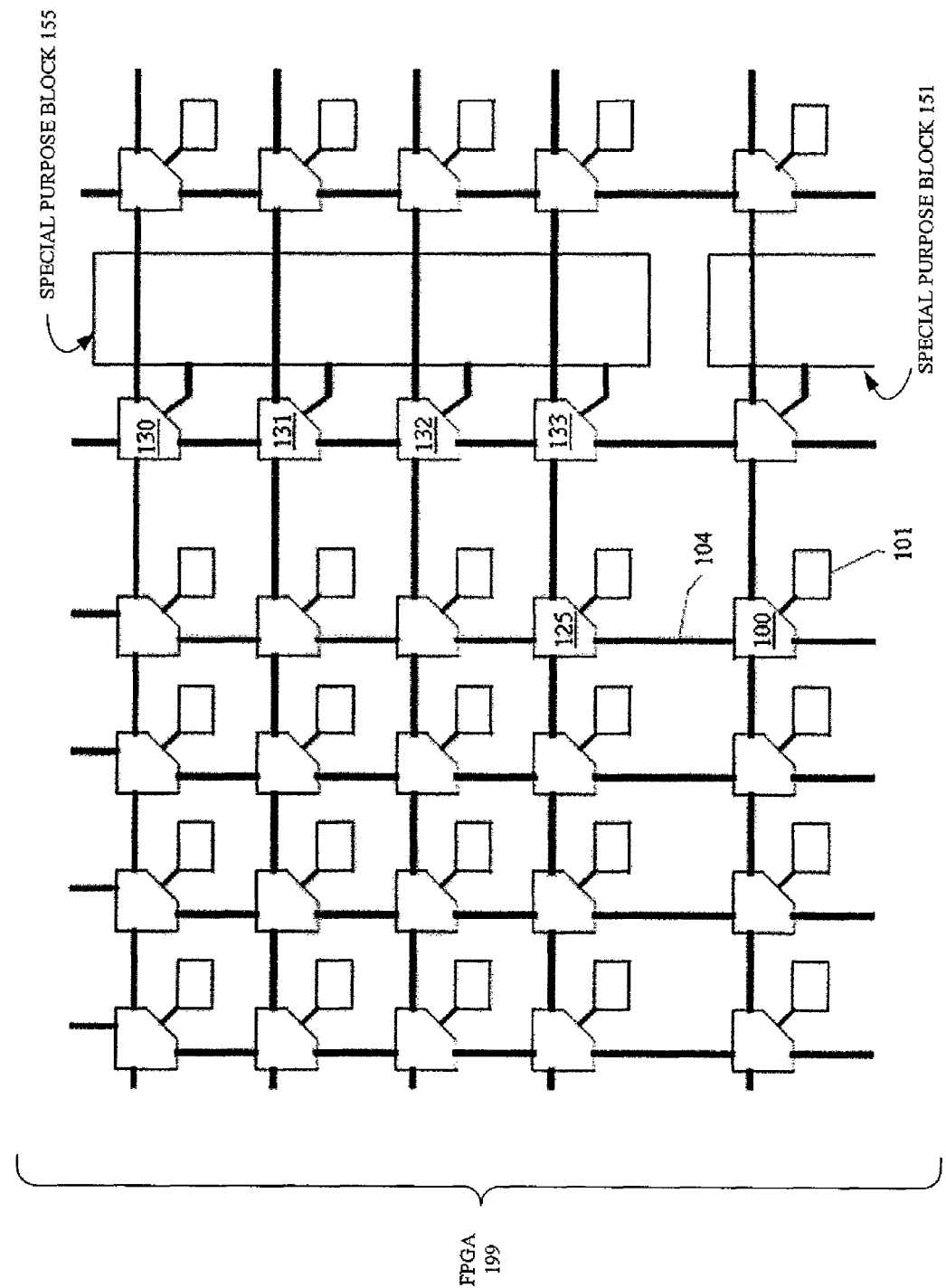
FIG. 1 shows an FPGA in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a system and method for using a single version of a MAC/PCS quad (MPQ) block (discussed below) in multiple physical layouts. In general, embodiments of the invention provide a system and method for using a MPQ block having a programmable layout select tag, where said layout select tag is used to specify the physical connections (e.g., wiring, traces) to lanes of the MPQ block.

FIG. 1 shows an FPGA (199) in accordance with one or more embodiments of the invention. As shown in FIG. 1, the FPGA (199) includes one or more programmable logic blocks (101), one or more configurable special-purpose blocks (151, 155), and one or more routing crossbars (XBARs) (100, 125, 130, 131, 132, 133). Each programmable logic block (101) may include one or more 4-input lookup tables (LUTs) (not shown) and one or more configurable 1-bit sequential cells (not shown). A configurable special-purpose block (151, 155) implements a widely-used function. Those skilled in the art, having the benefit of this detailed description, will appreciate the FPGA (199) may have more than one type of special-purpose block (151, 155).

As also shown in FIG. 1, the routing crossbars (XBARs) (100, 125, 130, 131, 132, 133) form a two-dimensional routing network that provides configurable connections among the programmable logic blocks (101) and the special-purpose blocks (151, 155). Each XBAR (100, 125, 130, 131, 132, 133) may be connected to the nearest-neighbor XBARs (100, 125, 130, 131, 132, 133) in four directions and to either a programmable logic block or a special-purpose block. For example, routing crossbar (125) and routing crossbar (100) are connected by buses (104). Although both programmable logic blocks and special-purpose blocks connect to XBARS (100, 125, 130, 131, 132, 133), special-purpose blocks are typically much larger than programmable logic blocks and typically have more input and output signals. Accordingly, a special-purpose block may be connected by a plurality of buses to a plurality of XBARs (100, 125, 130, 131, 132, 133) (e.g., special-purpose block (155) is connected to XBARs (130, 131, 132, 133)).

The programmable logic blocks (101), special-purpose blocks (151, 155), and routing crossbars (XBARs) (100, 125, 130, 131, 132, 133) contain configuration memory bits. A user's design is implemented in the FPGA (199) by setting the configuration memory bits appropriately. Several forms of configuration memory are used by contemporary FPGAs, the most common form being static random-access memory (SRAM).

Figure 2:
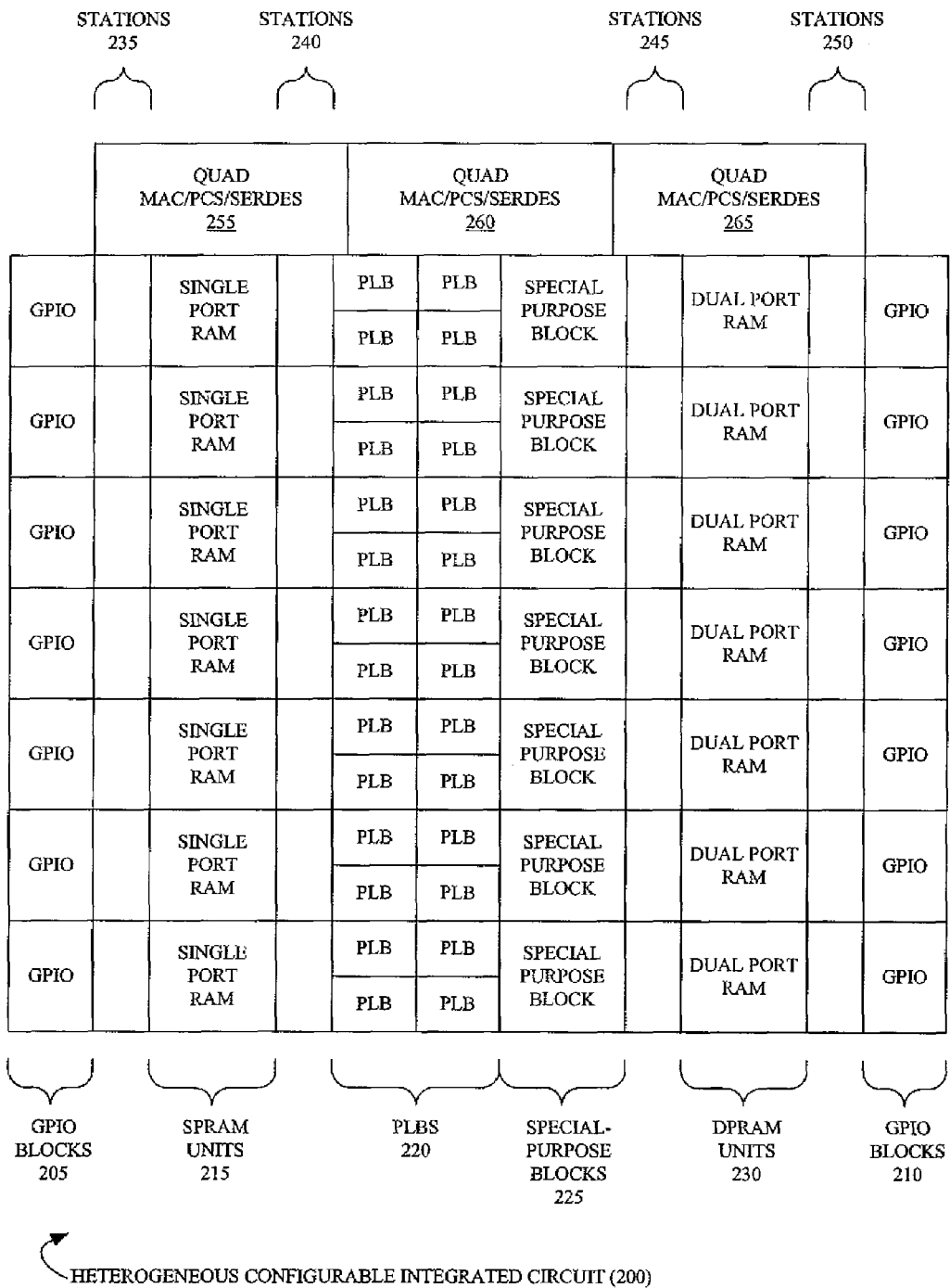
FIG. 2 shows a heterogeneous configurable integrated circuit (HCIC) in accordance with one or more embodiments of the invention.

FIG. 2 shows part of a heterogeneous configurable integrated circuit (HCIC) (200) in accordance with one or more embodiments of the invention. As shown in FIG. 2, the HCIC (200) includes multiple columns of general purpose input/output (GPIO) blocks (205, 210), a column of single port RAM units (SPRAM) (215), multiple columns of PLBs (220), a column of special-purpose blocks (225) (e.g., reconfigurable framer parser units, reconfigurable arithmetic units (RAU), reconfigurable content addressable memories (RCAM), memory controllers, etc.), a column of dual port RAM units (DPRAM) (230), multiple columns of stations (235, 240, 245, 250), and multiple quad media access control, physical coding sublayer, and serializer/deserializer (MAC/PCS/SERDES) units (255, 260, 265) bordering the HCIC (200). Those skilled in the art, having the benefit of this detailed description, will appreciate different embodiments of the invention may have a different number of MAC/PCS/SERDES units (255, 260, 265) and in different locations on the HCIC (200).

In one or more embodiments of the invention, the multiple stations (235, 240, 245, 250) form a data cross-connect (DCC) network. This DCC network is a two-dimensional grid of stations that spans the entire HCIC (200). In one or more embodiments of the invention, the DCC network is as described in U.S. application Ser. No. 11/901,182 entitled "High-Bandwidth Interconnect Network for an Integrated Circuit," which was previously incorporated by reference. In one or more embodiments of the invention, the HCIC (200) also includes a routing crossbar network (not shown) in a plane parallel to the DCC network.

Figure 3A:
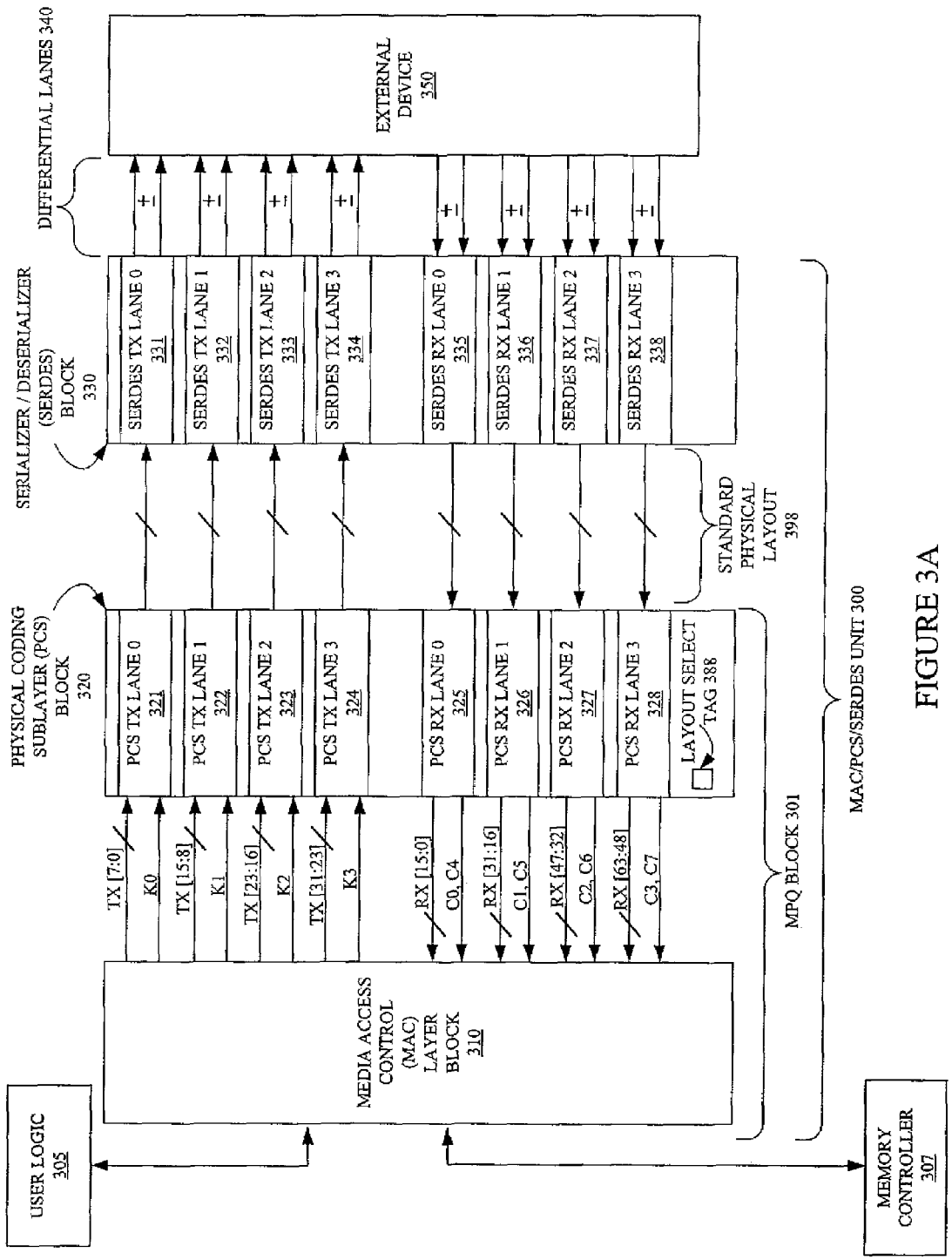
FIG. 3A and FIG. 3B show a MAC/PCS/SERDES unit operatively connected to an external device in accordance with one or more embodiments of the invention.

FIG. 3A shows a quad MAC/PCS/SERDES unit (300) in accordance with one or more embodiments of the invention. The MAC/PCS/SERDES unit (300) may be essentially the same as any MAC/PCS/SERDES unit (255, 260, 265) discussed above in reference to FIG. 2. As shown in FIG. 3A, the MAC/PCS/SERDES unit (300) includes a MAC layer block (310), a PCS block (320), and a SERDES block (330). The MAC/PCS/SERDES unit (300) is configured to transfer data between other blocks of the HCIC (200) (e.g., the user logic (305) and the memory controller (307)) and a device external to the HCIC (200) (e.g., the External Device (350)). In one or more embodiments of the invention, the MAC layer block (310) and the PCS block (320) may be part of a single block referred to as the MAC/PCS quad (MPQ) block (301), and the MPQ block (301) may be operatively connected to the other blocks of the HCIC (200) using the DCC network (discussed above in reference to FIG. 2).

In one or more embodiments of the invention, the MAC layer block (310) and the PCS block (320) communicate in accordance with the 10 Gigabit Media Independent Interface (XGMII) standard. In other words, a 32 bit transmit (TX) data path and a 64 bit receive (RX) data path exist between the MAC layer block (310) and the PCS block (320). Further, each data path is partitioned into four lanes (i.e., TX [7:0], TX [15:8], TX [23:16], TX [31:24], RX [15:0], RX [31:16], RX [47:32], RX [63:48]). Accordingly, the PCS block (320) includes four PCS Lanes (321-328) and one or more control signals (K0, K1, K2, K3, C0, C1, C2, C3, C4, C5, C6, C7) per data path to handle communication with the MAC layer block (310).

In one or more embodiments of the invention, the SERDES block (330) and the external device (350) communicate in accordance with the 10 Gigabit Attachment Unit Interface (XAUI) standard. In other words, a 4 differential pair TX data path and a 4 differential pair RX data path connect the SERDES block (330) and the External Device (350). Each of said differential pairs may be considered a differential lane (340). Accordingly, the SERDES block (330) includes four SERDES Lanes (331-338) per data path to handle communication with the External Device (350). In one or more embodiments of the invention, data is driven and received by the SERDES block (330) at a data-rate of 3.125 GHz per differential lane (340), and the SERDES block (330) is configured to handle both clock and data recovery.

In one or more embodiments of the invention, the PCS block (320) and the SERDES block (330) are connected according to a standard physical layout (398). The standard physical layout (398) effectively connects (e.g., using traces) the MPQ block (301) and the SERDES block (330) on a lane-by-lane basis. As shown in FIG. 3A, PCS TX Lane 0 (321) is operatively connected to SERDES TX Lane 0 (331)

in the standard physical layout (398). Similarly, PCS TX Lane 1 (322), PCS TX Lane 2 (323), PCS TX Lane 3 (324), PCS RX Lane 0 (325), PCS RX Lane 1 (326), PCS RX Lane 2 (327), and PCS RX Lane 3 (328) are operatively connected to SERDES TX Lane 1 (332), SERDES TX Lane 2 (333), SERDES TX Lane 3 (334), SERDES RX Lane 0 (335), SERDES RX Lane 1 (336), SERDES RX Lane 2 (337), and SERDES RX Lane 3 (338), respectively, in the standard physical layout (398).

In one or more embodiments of the invention, the PCS block (320) includes a programmable Layout Select Tag (388). The Layout Select Tag (388) is used to specify the physical layout connecting the PCS block (320) and the SERDES block (330). In one or more embodiments of the invention, the Layout Select Tag (388) is set to "0" or "false" to specify the PCS block (320) is connected to the SERDES block (330) using the standard physical layout (398). The Layout Select Tag (388) may be of any type (e.g., a boolean value, integer, etc.) and may be of any size (e.g., 1-bit, 2-bytes, etc.).

In one or more embodiments of the invention, the PCS block (320) and the SERDES block (330) must be connected according to the standard physical layout (398) to enable communication between the MAC layer block (310) and the External Device (350). Consider the following example which is not meant to limit the invention in any way. The SERDES block (330) may receive a start of frame (SOF) delimiter from the External Device (350) on SERDES RX Lane 0 (335). When using the XGMII standard for communication, the MAC layer block (310) is expecting said SOF delimiter on RX [15:0]. In the event that the SOF delimiter is received by the MAC layer block (310) on a different XGMII lane, the SOF delimiter may not be detected by the MAC layer block (310), and communication between the MPQ block (301) and the External Device (350) will fail. By specifying (i.e., using the Layout Select Tag (388)) that the PCS block (320) and the SERDES block (330) are connected according to the standard physical layout (398), it is ensured that SERDES RX Lane 0 (335) is mapped to RX [15:0]. Similarly, it is ensured that SERDES TX Lane 0 (331), SERDES TX Lane 1 (332), SERDES TX Lane 2 (333), SERDES TX Lane 3 (334), SERDES RX Lane 0 (335), SERDES RX Lane 1 (336), SERDES RX Lane 2 (337), and SERDES RX Lane 3 (338) are mapped to TX [7:0], TX [15:8], TX [23:16], TX [31:24], RX [15:0], RX [31:16], RX [47:32], and RX [63:48], respectively.

Figure 3B:
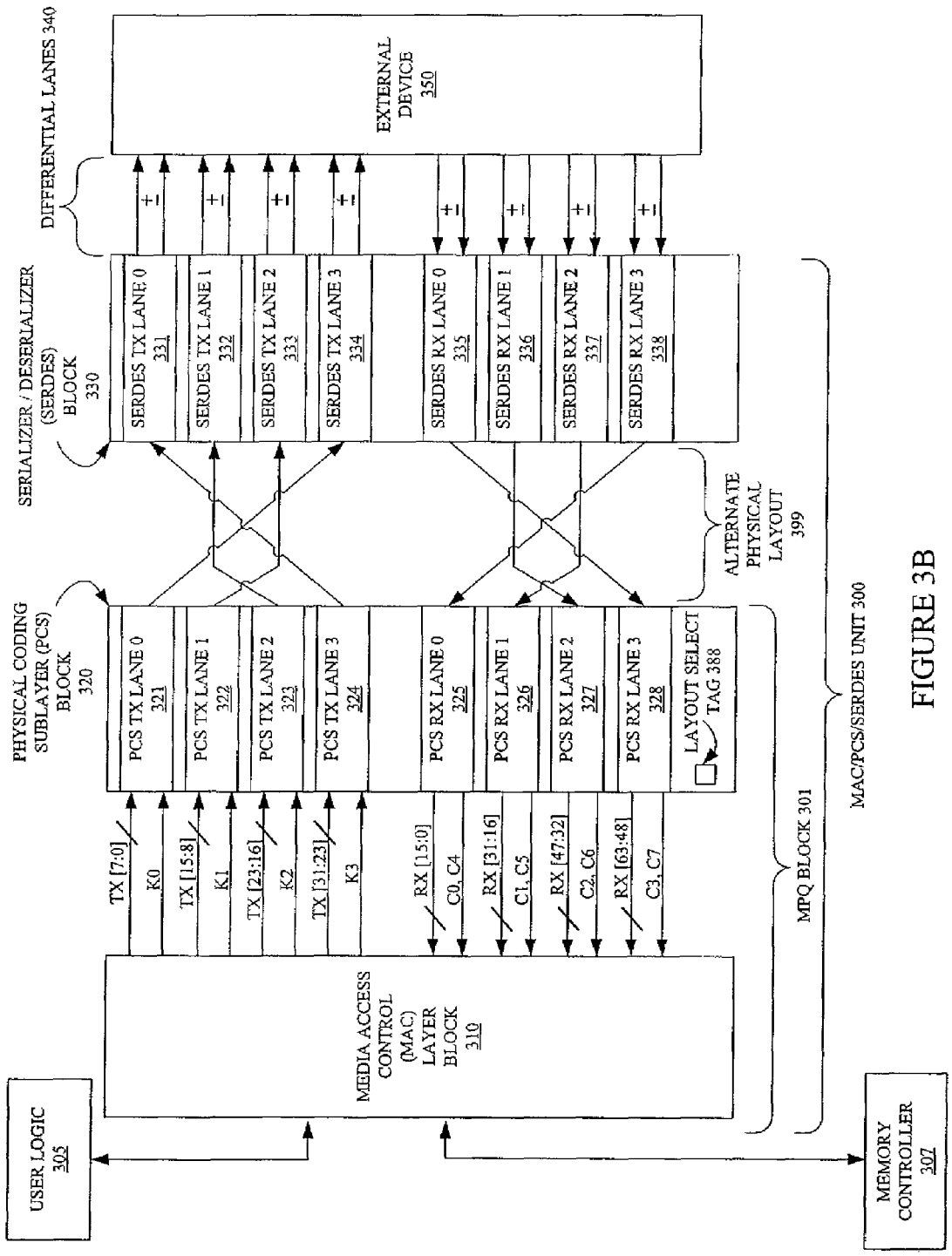

FIG. 3B shows a MAC/PCS/SERDES unit (300) in accordance with one or more embodiments of the invention. FIG. 3B is essentially the same as FIG. 3A. However, in FIG. 3B, the PCS block (320) and the SERDES block (330) are connected according to an alternate physical layout (399). In other words, the PCS block (320) and the SERDES block (330) are not connected according to the standard physical layout (398).

As shown in FIG. 3B, in the alternate physical layout (399), PCS TX Lane 0 (321), PCS TX Lane 1 (322), PCS TX Lane 2 (323), PCS TX Lane 3 (324), PCS RX Lane 0 (325), PCS RX Lane 1 (326), PCS RX Lane 2 (327), and PCS RX Lane 3 (328) are operatively connected (e.g., using traces) to SERDES TX Lane 3 (334), SERDES TX Lane 2 (333), SERDES TX Lane 1 (332), SERDES TX Lane 0 (331), SERDES RX Lane 3 (338), SERDES RX Lane 2 (337), SERDES RX Lane 1 (336), and SERDES RX Lane 0 (335), respectively. In one or more embodiments of the invention, the Layout Select Tag (388) is set (i.e., programmed) to specify that the PCS block (320) is connected to the SERDES block (330) using the alternate physical layout (398).

Those skilled in the art, having the benefit of this detailed description, will appreciate that for a given data pat (i.e., TX or RX), the alternative physical layout (399) may be essentially considered the reverse of the standard physical layout (398). In one or more embodiments of the invention, the Layout Select Tag (388) is set to "1" or "true" to indicate the PCS block (320) is connected to the SERDES block (330) using the alternate physical layout (399).

In one or more embodiments of the invention, the PCS block (320) is configured to map the SERDES lanes (331-338) with the XGMII lanes according to the standard physical layout (398), regardless of the actual physical layout connecting the PCS block (320) and the SERDES block (330). In other words, the PCS block (320) includes additional logic (discussed below) to make the true physical layout transparent to the MAC layer block (310). Accordingly, although SERDES TX Lane 0 (331) is connected to PCS TX Lane 3 (324) in alternate physical layout (399), and TX [7:0] is connected to PCS TX Lane 0 (321), the PCS block (320) is configured to map SERDES TX Lane 0 (331) to TX [7:0]. Similarly, although SERDES TX Lane 3 (332) is connected to PCS TX Lane 0 (321) in the alternate physical layout (399), and TX [23:16] is connected to PCS TX Lane 3 (324), the PCS block (320) is configured to map SERDES TX Lane 3 (334) to TX [23:16].

As discussed above, in one or more embodiments of the invention, the SERDES block (330) may receive a start of frame (SOF) delimiter from the External Device (350) on SERDES RX Lane 0 (335). Although SERDES RX Lane 0 (335) is connected to PCS RX Lane 3 (328) using the alternate physical layout (399), the PCS block (320) effectively maps SERDES RX Lane 0 (335) to RX [15:0] (i.e., as set forth in the standard physical layout (398)). Accordingly, despite the PCS block (320) and the SERDES block (330) being connected using the alternate physical layout (399), the SOF delimiter will be received, as required, by the MAC layer block (310) on RX [15:0].

In addition, in one or more embodiments of the invention, the MAC layer block (310) may issue a SOF delimiter on TX [7:0], and said SOF delimiter must be received by the External Device (350) from SERDES TX Lane 0 (331) for successful communication between the MAC layer block (310) and the External Device (350). As shown in FIG. 3B, the issued SOF is received by PCS TX Lane 0 (321). Although SERDES TX Lane 0 (331) is connected to PCS TX Lane 3 (324) using the alternate physical layout (399), the PCS block (320) effectively maps PCS TX Lane 0 (321) to SERDES TX Lane 0 (331) (i.e., as set forth in the standard physical layout (398)). Accordingly, despite the PCS block (320) and the SERDES block (330) being connected using the alternate physical layout (399), the SOF delimiter will be received by SERDES TX Lane 0 (331), as required, and sent to the External Device (350).

Figure 4:
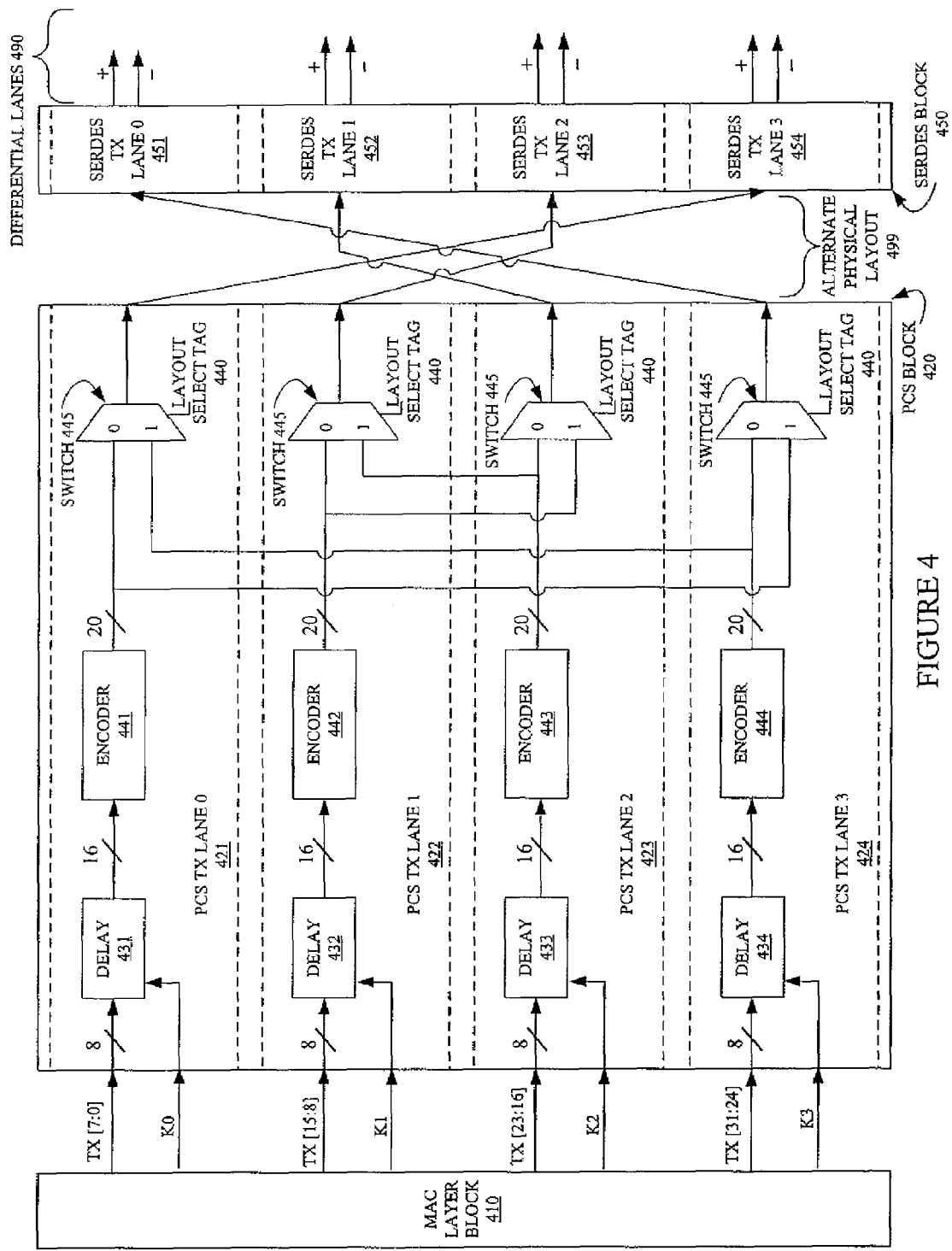
FIG. 4 shows transmission of data from a MAC/PCS/SERDES unit to an external device in accordance with one or more embodiments of the invention.

FIG. 4 shows the transmission (i.e., TX) data path of a MAC/PCS/SERDES unit in accordance with one or more embodiments of the invention. The MAC layer block (410), the PCS block (420), and the SERDES block (450) are essentially the same as the MAC layer block (310), the PCS block (320), and the SERDES block (330), discussed above in reference to FIG. 3A and 3B. The PCS Lanes (421-424) and the SERDES Lanes (451-454) are also essentially the same as the PCS Lanes (321-324) and the SERDES Lanes (331-334), respectively, discussed above in reference to FIG. 3A and 3B. In one or more embodiments, each PCS Lane (421-424) of the PCS block (420) includes a delay (431-434), an encoder (441-444), and a switch (445). As shown in FIG. 4, the PCS block (420) and the SERDES block (450) are connected using the alternate physical layout (499), which is essentially the same as the alternate physical layout (399), discussed above in reference to FIG. 3B.

In one or more embodiments of the invention, each PCS Lane (421-424) includes a delay (431-434). The delay (431-434) may be used to change the number of data streams (i.e., arriving from the MAC layer block (410)) in the lane based on one or more control signals (K0, K1, K2, K3). As shown in FIG. 4, the delay (431-434) is used to increase the number of data streams from 8 to 16. In one or more embodiments of the invention, the delay (431-434) is also used to reduce the bit rate of the incoming data streams. Those skilled in the art, having the benefit of this detailed description, will appreciate that if the delay (431-434) reduces the incoming bit rate by one half and doubles the number of data streams, the effective bit throughput is unchanged.

In one or more embodiments of the invention, each PCS Lane (421-424) includes an encoder (441-444) to encode each of the 16 incoming data streams. The encoder (441-444) may divide the 16 incoming data streams into two groups (i.e., two groups of 8). Each group is encoded using an 8B/10B encoder. Accordingly, as shown in FIG. 4, 20 data streams leave the encoder (441-444) and are fed into multiple switches (445).

In one or more embodiments of the invention, each PCS Lane (421-424) includes a switch controlled by the Layout Select Tag (440). The Layout Select Tag (440) may be essentially the same as the Layout Select Tag (388) discussed above in reference to FIG. 3A and FIG. 3B. As shown in FIG. 4, the switch (445) inputs the 20 data streams from the encoders (441-444).

Those skilled in the art, having the benefit of this detailed description, will appreciate that although the PCS block (420) and the SERDES block (450) are connected according to the alternative physical layout (499), by setting the Layout Select Tag (440) appropriately and using the Layout Select Tag (440) to control the switches (445), the PCS block (420) can map the SERDES lanes (451-454) with the XGMII lanes according to the standard physical layout (398). In other words, the PCS block (420) can map SERDES TX Lane 0 (451), SERDES TX Lane 1(452), SERDES TX Lane 2 (453), and SERDES TX Lane 3 (454) to TX [7:0], TX [15:8], TX [23:16], and TX [31:24], respectively, despite the use of the alternative physical layout (499) to connect the PCS block (420) and the SERDES block (450).

In one or more embodiments of the invention, each SERDES lane (451-454) is configured to serialize data arriving from a PCS lane (421-424) prior to transmitting said data to an external device (not shown) using one of the differential lanes (490).

Figure 5:
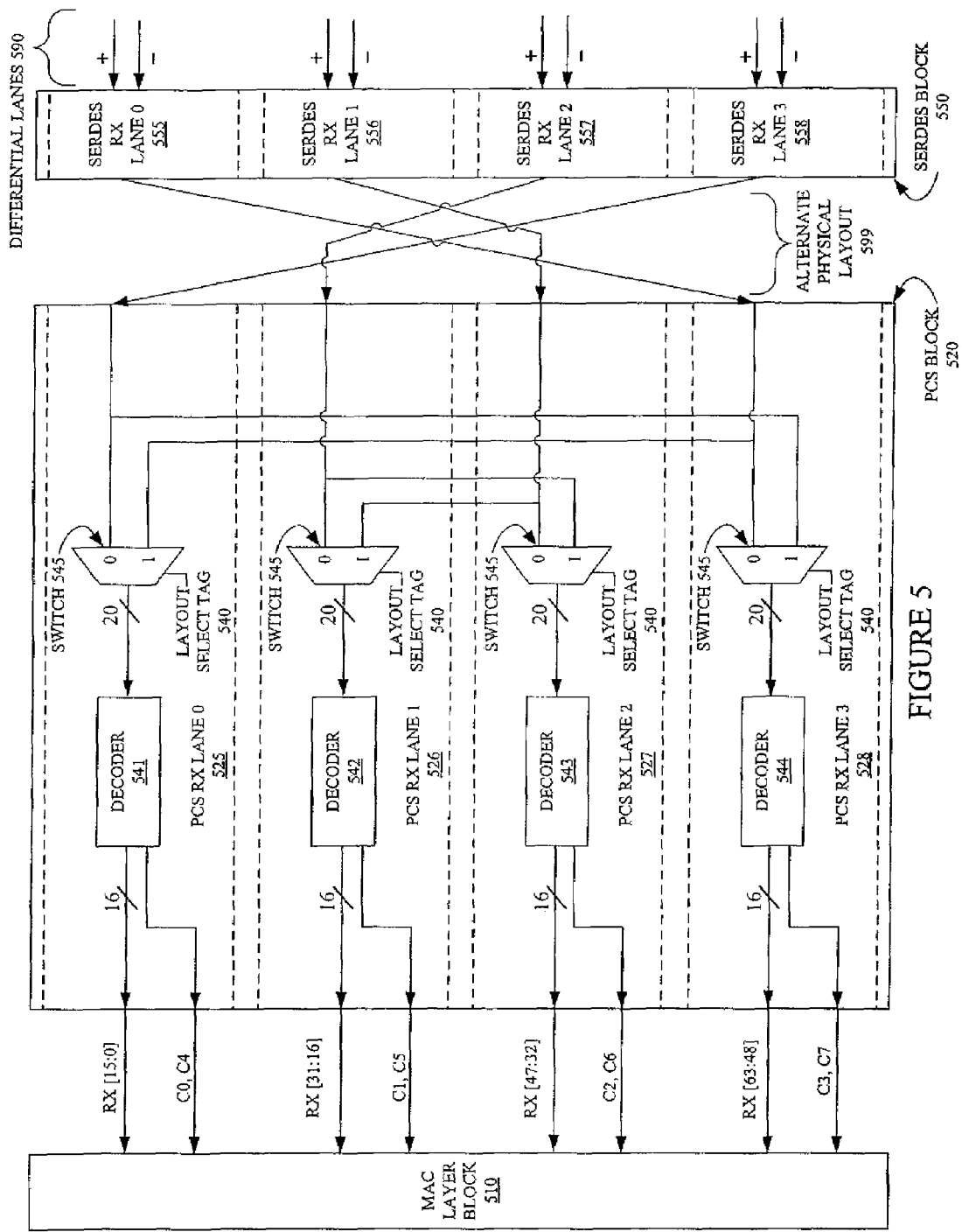
FIG. 5 shows transmission of data from an external device to a MAC/PCS/SERDES unit in accordance with one or more embodiments of the invention.

FIG. 5 shows the receiving (i.e., RX) data path of a MAC/PCS/SERDES unit in accordance with one or more embodiments of the invention. The MAC layer block (510), the PCS block (520), and the SERDES block (550) are essentially the same as the MAC layer block (310), the PCS block (320), and the SERDES block (330), discussed above in reference to FIG. 3A and 3B. The PCS Lanes (525-528) and the SERDES Lanes (555-558) are also essentially the same as the PCS Lanes (325-328) and the SERDES Lanes (335-338), respectively, discussed above in reference to FIG. 3A and 3B.

In one or more embodiments, each PCS Lane (525-528) of the PCS block (520) includes a decoder (541-544), and a switch (545). As shown in FIG. 5, the PCS block (520) is connected to the SERDES block (550) using the alternate physical layout (599), which is essentially the same as the alternate physical layout (399), discussed above in reference to FIG. 3B.

In one or more embodiments of the invention, each SERDES lane (555-558) is configured to deserialize data arriving from an external device (not shown). Said data may arrive from the external device using the differential lanes (590). Each SERDES lane (555-558) subsequently transmits the deserialized data to multiple switches (545) in the PCS block (520). In one or more embodiments of the invention, each SERDES Lane (555-558) outputs 20 data streams in parallel.

In one or more embodiments of the invention, each PCS Lane (525-528) includes a switch controlled by the Layout Select Tag (540). The Layout Select Tag (540) may be essentially the same as the Layout Select Tag (388) discussed above in reference to FIG. 3A and FIG. 3B. As shown in FIG. 5, the switch (545) inputs the data streams from the SERDES Lanes (555-558).

Those skilled in the art, having the benefit of this detailed description, will appreciate that although the PCS block (520) and the SERDES block (550) are connected according to the Alternative Physical Layout (599), by setting the Layout Select Tag (540) appropriately and using the Layout Select Tag (540) to control the switches (545), the PCS block (520) can map the SERDES Lanes (555-558) with the XGMII lanes according to the standard physical layout (398). In other words, the PCS block (520) can map SERDES RX Lane 0 (555), SERDES RX Lane 1 (556), SERDES RX Lane 2 (557), and SERDES RX Lane 3 (558), to RX [15:0], RX [31:16], RX [47:32], and RX [63:48], respectively, despite the use of the alternative physical layout (499) to connect the PCS block (420) and the SERDES block (450).

In one or more embodiments of the invention, data from the external device has been subjected to 8B/10B encoding. Accordingly, each PCS Lane (525-528) includes a decoder (541-544) to decode each of the 20 incoming data streams. The decoder (541-544) may divide the 20 incoming data streams into two groups (i.e., two groups of 10). Each group is decoded using an 8B/10B decoder. Accordingly, as shown in FIG. 5, 16 data streams leave the decoder (541-544). The 16 data streams and one or more control signals (i.e., C0, C1, C2, C3, C4, C5, C6, C7) are transmitted to the MAC layer block (510).

Although embodiments of the invention have focused on two physical layouts (i.e., standard physical layout (398) and alternate physical layout (399)), those skilled in the art, having the benefit of this detailed description, will appreciate that an MPQ block may be connected to a SERDES block using any physical layout. The physical layout being used to connect the SERDES block and the MPQ block is specified by programming the layout select tag. The MPQ block includes the necessary logic to map the lanes of the SERDES block to the appropriate XGMII lanes.

Those skilled in the art, having the benefit of this detailed description, will appreciate that in one or more embodiments of the invention, an external device may be connected to the SERDES block is a reverse manner, and still communicate with the MAC layer block. Consider the following example which is not meant to limit the invention in any way. Referring to FIG. 3A, during normal operation, port 0 (not shown) of the External Device (350) is attached to SERDES RX Lane 0 (335). Similarly, port 1 (not shown) is attached to SERDES RX Lane 1 (336), port 2 (not shown) is attached to SERDES RX Lane 2 (337), and port 3 (not shown) is attached to SERDES RX Lane 3 (338).

In the event that the External Device (350) is connected to the SERDES block (330) in the reverse manner (i.e., port 3 is attached to SERDES RX Lane 0 (335), port 2 is attached to SERDES RX Lane 1 (336), port I is attached to SERDES RX Lane 2 (337), and port 0 is attached to SERDES RX Lane 3

(338)), communication between the External Device (350) and the MAC layer block (310) is possible by setting the layout select tag (388) to incorrectly specify the alternate physical layout is in use. In other words, although FIG. 3A clearly shows the SERDES block (350) connected to the MPQ block (301) according to the standard physical layout (398), in the event the External Device (350) is connected to the SERDES block (350) in a reverse manner, by setting the layout select tag (388) to indicate the alternate physical layout (399) is being used, communication between the MAC layer block (310) and the External Device (350) is still possible.

Similarly, referring to FIG. 3B, in the event that the External Device (350) is connected to the SERDES block (330) in the reverse manner (i.e., port 3 is attached to SERDES RX Lane 0 (335), port 2 is attached to SERDES RX Lane 1 (336), port 1 is attached to SERDES RX Lane 2 (337), and port 0 is attached to SERDES RX Lane 3 (338)), communication between the External Device (350) and the MAC layer block (310) is possible by setting the layout select tag (388) to incorrectly specify the standard physical layout is in use. In other words, although FIG. 3B clearly shows the SERDES block (350) connected to the MPQ block (301) according to the alternate physical layout (399), in the event the External Device (350) is connected to the SERDES block (350) in a reverse manner, by setting the layout select tag (388) to indicate the standard physical layout (399) is being used, communication between the MAC layer block (310) and the External Device (350) is still possible.

Advantages of one or more embodiments of the invention include the ability to use a single version of a MPQ block in any physical layout, effectively expanding circuit board design and substrate design flexibility.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system comprising:
a serializer/deserializer (SERDES) block comprising a first SERDES lane, a second SERDES lane, a third SERDES lane, and a fourth SERDES lane;
a physical coding sublayer (PCS) block comprising a layout select tag, a first PCS lane operatively connected to the fourth SERDES lane, a second PCS lane operatively connected to the third SERDES lane, a third PCS lane operatively connected to the second SERDES lane, and a fourth PCS lane operatively connected to the first SERDES lane;
a media access control (MAC) layer block comprising a first plurality of pins operatively connected to the first PCS lane, a second plurality of pins operatively connected to the second PCS lane, a third plurality of pins operatively connected to the third PCS lane, and a fourth plurality of pins operatively connected to the fourth PCS lane;
a first differential lane operatively connected to the first SERDES lane;
a second differential lane operatively connected to the second SERDES lane;
a third differential lane operatively connected to the third SERDES lane;
a fourth differential lane operatively connected to the fourth SERDES lane; and
a device operatively connected to the first differential lane, the second differential lane, the third differential lane, and the fourth differential lane,
wherein the device transmits a start of frame (SOF) delimiter on the first differential lane,
wherein the value of the layout select tag is true,
wherein the first SERDES lane is configured to serialize a plurality of data streams associated with the first PCS lane,
wherein the PCS block is configured to map the first SERDES lane to the first plurality of pins, the second SERDES lane to the second plurality of pins, the third SERDES lane to the third plurality of pins, and the fourth SERDES lane to the fourth plurality of pins based on a value of the layout select tag.

2. The system of claim 1, wherein the SERDES block, the PCS block, and the MAC layer block are disposed on a heterogeneous configurable integrated circuit (HCIC), and wherein the MAC layer block is connected to a data cross-connect network of the HCIC.

3. The system of claim 1, further comprising:
an 8B/10B encoder in at least one selected from a group consisting of the first PCS lane, the second PCS lane, the third PCS lane, and the fourth PCS lane,
wherein the first plurality of pins, the second plurality of pins, the third plurality of pins, and the fourth plurality of pins are associated with a 10 Gigabit Media Independent Interface (XGMII), and
wherein the first differential lane, the second differential lane, the third differential lane, and the fourth differential lane are associated with a 10 Gigabit Attachment Unit Interface (XAUI).

4. The system of claim 1, wherein the first PCS lane comprises:
a multiplexer inputting the first SERDES lane and the fourth SERDES lane, wherein the multiplexer is controlled using the layout select tag.

5. The system of claim 1, wherein at least one selected from a group consisting of the first differential lane, the second differential lane, the third differential lane, and the fourth differential lane operate at a data-rate of 3.125 GHz.

6. A system comprising:
a serializer/deserializer (SERDES) block comprising a first SERDES lane, a second SERDES lane, a third SERDES lane, and a fourth SERDES lane;
a physical coding sublayer (PCS) block comprising a layout select tag, a first PCS lane operatively connected to the fourth SERDES lane, a second PCS lane operatively connected to the third SERDES lane, a third PCS lane operatively connected to the second SERDES lane, and a fourth PCS lane operatively connected to the first SERDES lane;
a media access control (MAC) layer block comprising a first plurality of pins operatively connected to the first PCS lane, a second plurality of pins operatively connected to the second PCS lane, a third plurality of pins operatively connected to the third PCS lane, and a fourth plurality of pins operatively connected to the fourth PCS lane;
a first differential lane operatively connected to the first SERDES lane;
a second differential lane operatively connected to the second SERDES lane;
a third differential lane operatively connected to the third SERDES lane;
a fourth differential lane operatively connected to the fourth SERDES lane; and a device operatively connected to the first differential lane, the second differential lane, and the third differential lane, and the fourth differential lane, wherein the device transmit a start of frame (S OF) delimiter on the fourth differential lane, wherein the value of the layout select tag is false, and wherein the PCS block is configured to map the first SERDES lane to the first plurality of pins, the second SERDES lane to the second plurality of pins, the third SERDES lane to the third plurality of pins, and the fourth SERDES lane to the fourth plurality of pins based on a value of the layout select tag.

7. A method of manufacture comprising:

disposing a first serializer/deserializer (SERDES) block comprising a first SERDES lane, a second SERDES lane, a third SERDES lane, and a fourth SERDES lane on a board;

disposing a first physical coding sublayer (PCS) block comprising a first layout select tag, a first PCS lane, a second PCS lane, a third PCS lane, and a fourth PCS lane on the board; and connecting the first PCS block to the first SERDES block on the board according to a first layout, wherein the first layout connects the first PCS lane to fourth SERDES lane, the second PCS lane to the third SERDES lane, the third PCS lane to the second SERDES lane, and the fourth PCS lane to the first SERDES lane, wherein the first PCS lane is operatively connected to a first plurality of pins on a media access control (MAC) layer block, the second PCS lane is operatively connected to a second plurality of pins on the MAC layer block, the third PCS lane is operatively connected to a third plurality of pins on the MAC layer block, and the fourth PCS lane is operatively connected to a fourth plurality of pins on the MAC layer block; and wherein the PCS block is configured to map the fourth SERDES lane to the first plurality of pins, the third SERDES lane to the second plurality of pins, the second SERDES lane to the third plurality of pins, and the first SERDES lane to the fourth plurality of pins based on a value of the first layout select tag, wherein the first SERDES block transfers a data element to the first PCS lane, wherein the data element is a start of frame (SOF) delimiter from an external device attached to the SERDES via a differential lane.

8. The method of claim 7, further comprising:

disposing a second PCS block on the board comprising a second layout select tag, a fifth PCS lane, a sixth PCS lane, a seventh PCS lane, and an eighth PCS lane;

disposing a second SERDES block on the board comprising a fifth SERDES lane, a sixth SERDES lane, a seventh SERDES lane, and an eighth SERDES lane; and connecting the second PCS block with a second SERDES block on the board according to a second layout, wherein the second layout is a reversal of the first layout.

9. The method of claim 8, wherein a value of the first layout select tag is true and a value of the second layout select tag is false.

10. The method of claim 7, further comprising:

connecting a data cross-connect (DCC) network of a heterogeneous configurable integrated circuit (HCIC) with the MAC layer block.

11. The method of claim 7, wherein the first SERDES block comprises a plurality of differential lanes operating according to a 10 Gigabit Attachment Unit Interface (XAUI) standard.

12. The method of claim 7, wherein at least one selected from a group consisting of the first PCS lane, the second PCS lane, the third PCS lane, and the fourth PCS lane comprises an 8B/10B encoder.

13. The method of claim 7, wherein at least one selected from a group consisting of the first layout and a second layout comprises a plurality of traces.

14. A method comprising:

setting a layout select tag of a physical coding sublayer (PCS) block bases on a layout connecting the PCS block and a serializer/deserializer (SERDES) block, wherein the PCS block comprises a first PCS lane, a second PCS lane, a third PCS lane, and a fourth PCS lane;

transferring a data element from the SERDES block to the first PCS lane; and forwarding the data element from the first PCS lane to a media access control (MAC) layer block operatively connected to the fourth PCS lane based on the layout select tag, wherein the data element is a start of frame (SOF) delimiter from an external device attached to the SERDES using a differential lane.

15. The method of claim 14, further comprising:

decoding the data element before forwarding the data element.

16. The method of claim 14, wherein forwarding the data element occurs based on a 10 Gigabit Media Independent Interface (XGMII) standard.

17. The method of claim 14, wherein the SERDES element receives the data element using differential pair from a 10 Gigabit Attachment Unit Interface (XAUI) device.

* * * * *